(12) United States Patent
Pfeiffer et al.

(10) Patent No.: US 6,937,537 B2
(45) Date of Patent: Aug. 30, 2005

(54) SEMICONDUCTOR MEMORY WITH ADDRESS DECODING UNIT, AND ADDRESS LOADING METHOD

(75) Inventors: Johann Pfeiffer, Ottobrunn (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 147 days.

(21) Appl. No.: 10/462,419

(22) Filed: Jun. 16, 2003

(65) Prior Publication Data

US 2003/0231535 A1 Dec. 18, 2003

(30) Foreign Application Priority Data

Jun. 14, 2002 (DE) .......................................... 102 26 485

(51) Int. Cl.$^7$ ................................................. G11C 8/00
(52) U.S. Cl. ............................ 365/230.03; 365/230.06; 365/230.02
(58) Field of Search ........................ 365/230.03, 230.06, 365/230.02

(56) References Cited

U.S. PATENT DOCUMENTS

| | | | | |
|---|---|---|---|---|
| 5,986,965 A | * | 11/1999 | Lee | 365/230.06 |
| 6,205,076 B1 | * | 3/2001 | Wakayama et al. | 365/230.03 |
| 2002/0054518 A1 | | 5/2002 | Ooishi et al. | |

* cited by examiner

*Primary Examiner*—Huan Hoang
(74) *Attorney, Agent, or Firm*—Laurence A. Greenberg; Werner H. Stemer; Gregory L. Mayback

(57) ABSTRACT

A semiconductor memory includes: at least two memory banks that each have a memory cell matrix, an address decoding unit which includes a bank address decoding unit, a row address decoding unit and a column address decoding unit. At least one demultiplexer is connected upstream of the address buffer memories provided in the row address decoding unit and/or in the column address decoding unit. This demultiplexer is connected to the bank address decoder in order, on the basis of the decoded bank address, to activate the corresponding address buffer memory.

5 Claims, 2 Drawing Sheets

SEMICONDUCTOR MEMORY WITH ADDRESS DECODING UNIT, AND ADDRESS LOADING METHOD

BACKGROUND OF THE INVENTION

Field of the Invention

The invention relates to a semiconductor memory, particularly a DRAM (Dynamic Random Access Memory), which has a plurality of similar memory banks which each include a quadratic matrix of memory cells. The invention also relates to an address loading method for such a semiconductor memory.

During read or write access to the DRAM, an address decoding unit uses a physical memory address to ascertain the memory bank and the addressed memory cell in this memory bank. Conventionally, during such an access, this involves transferring a read/write changeover signal, a "write-enable signal", a row address activation signal, a "row address strobe" RAS, a column activation signal, and a "column address strobe" CAS to a DRAM controller. For access to the addressed memory cell, the RAS signal is first activated. The address decoding unit's row address buffers assigned to the individual memory banks then adopt the row address of the addressed memory cell. At the same time, a bank address decoder ascertains the memory bank in which the addressed memory cell/row is situated and activates the corresponding row address buffer with the stored row address. The selected row address buffer then drives the stored row address to an associated row decoder in the address decoding unit. This row decoder ascertains the addressed row in the memory cell array in the memory bank that responds via a corresponding word line WL.

Next, the CAS signal is activated and the DRAM controller writes the desired column address of the selected memory cell to the address decoding unit's column address buffers associated with the respective memory banks. The bank decoder in turn ascertains the memory bank containing the addressed memory cell/column and activates the corresponding memory address buffer with the stored column address. The selected memory address buffer then transfers the column address to the associated column address decoder, which ascertains the sought column within the memory cell array that responds via a corresponding bit line pair BL, −BL.

During a read access, the bit found is output by the addressed memory cell, is then amplified by a sense amplifier and is written to a data output buffer in the DRAM memory. For storage access, the DRAM controller additionally activates the WE signal. The information to be written is then transferred to a data input buffer, and is then forwarded to the addressed memory cell by a sense amplifier and is stored in the memory cell.

During the read or write access in a DRAM memory containing a plurality of memory banks, the row and column addresses for the selected memory cell are thus routed to all the memory banks and are stored in the corresponding row address and column address buffers in the address decoding unit. When the memory bank address decoded by the bank decoder has been applied, the selected row address or column address buffer then drives the row or column address on to the associated row-address or column address decoder, which decodes the selected row or column address. A drawback of this procedure is that, during the read or write operation, the row address and column address buffers of all the memory banks are always loaded with the respective address, even though a single memory bank is intended to be accessed. The consequence of this is that a large charging current is required, since all the signal lines and input gates in the corresponding row address and column address buffers need to be activated to store the row and column addresses.

Published U.S. patent application Ser. No. 20020054518 discloses a semiconductor memory in which the column address and the row address buses are combined into a common bus which is routed to the individual banks of the semiconductor memory. In this case, the address decoding unit has a demultiplexer connection upstream of the address decoder and the address buffer in order to be able to change over between the column address and the row address.

SUMMARY OF THE INVENTION

It is accordingly an object of the invention to provide a semiconductor memory and a method for loading an address for a memory cell in the semiconductor memory that are distinguished by a low power consumption.

With the foregoing and other objects in view there is provided, in accordance with the invention, a semiconductor memory. The semiconductor memory includes an address decoding unit which has a bank address decoding unit, a row address decoding unit and a column address decoding unit, where the row address decoding unit and/or the column address decoding unit have, for each memory bank, a series circuit including an address buffer memory and an address decoder and additionally have a demultiplexer. The demultiplexer is connected upstream of the address buffer memories and is connected to the bank address decoder in order to activate the corresponding address buffer memory on the basis of the decoded bank address.

This inventive design of the row address and column address decoding units with an additional demultiplexer which activates the associated address buffer memory on the basis of the decoded memory bank address ensures a fundamental saving of power consumption, since only the address buffer memory for that memory bank containing the addressed memory cell is reloaded. This is because only a charging current for the corresponding selected address buffer memory is required, unlike conventional solutions, in which all the address buffer memories need to be reloaded afresh. In addition, the driver unit which amplifies the row address and column address signals and forwards them to the address buffers can also have small dimensions, i.e. can have just a relatively low power consumption, since the respective address needs to be forwarded only to a singled address buffer instead of to the address buffers for all the memory banks.

In line with one preferred embodiment, if n memory banks are provided, where n is greater than 2, the demultiplexer in the row and column address decoding units is a 1-off-n demultiplexer. This allows the demultiplexer to be produced centrally between the memory banks of the DRAM memory so as to save space, as a result of which, additionally, short line connections to the memory banks preferably arranged symmetrically about this center can be achieved.

In line with another preferred embodiment, if $2^m$ memory banks are provided, where m is greater than 1, the demultiplexer and the address decoding unit is in the form of an cascade circuit with $2^m-1$ 1-of-2 demultiplexers. This demultiplexer cascade circuit affords the opportunity for the individual demultiplexer units to be proportioned to be very small, as a result of which, the power consumption required for operating the respective signals can be reduced to a minimum. In addition, these decoding units of small proportions can be beneficially accommodated on free areas on the memory chip.

Other features which are considered as characteristic for the invention are set forth in the appended claims.

Although the invention is illustrated and described herein as embodied in a semiconductor memory with address decoding unit, and address loading method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention is illustrated using the example of a DRAM memory having four memory banks. However, it can, in principle, be used for DRAM memories having more than two memory banks. The invention is also not limited to DRAM memories, but rather can be used for all memory systems that have similar memory banks with a respective memory cell matrix.

Figure 1:
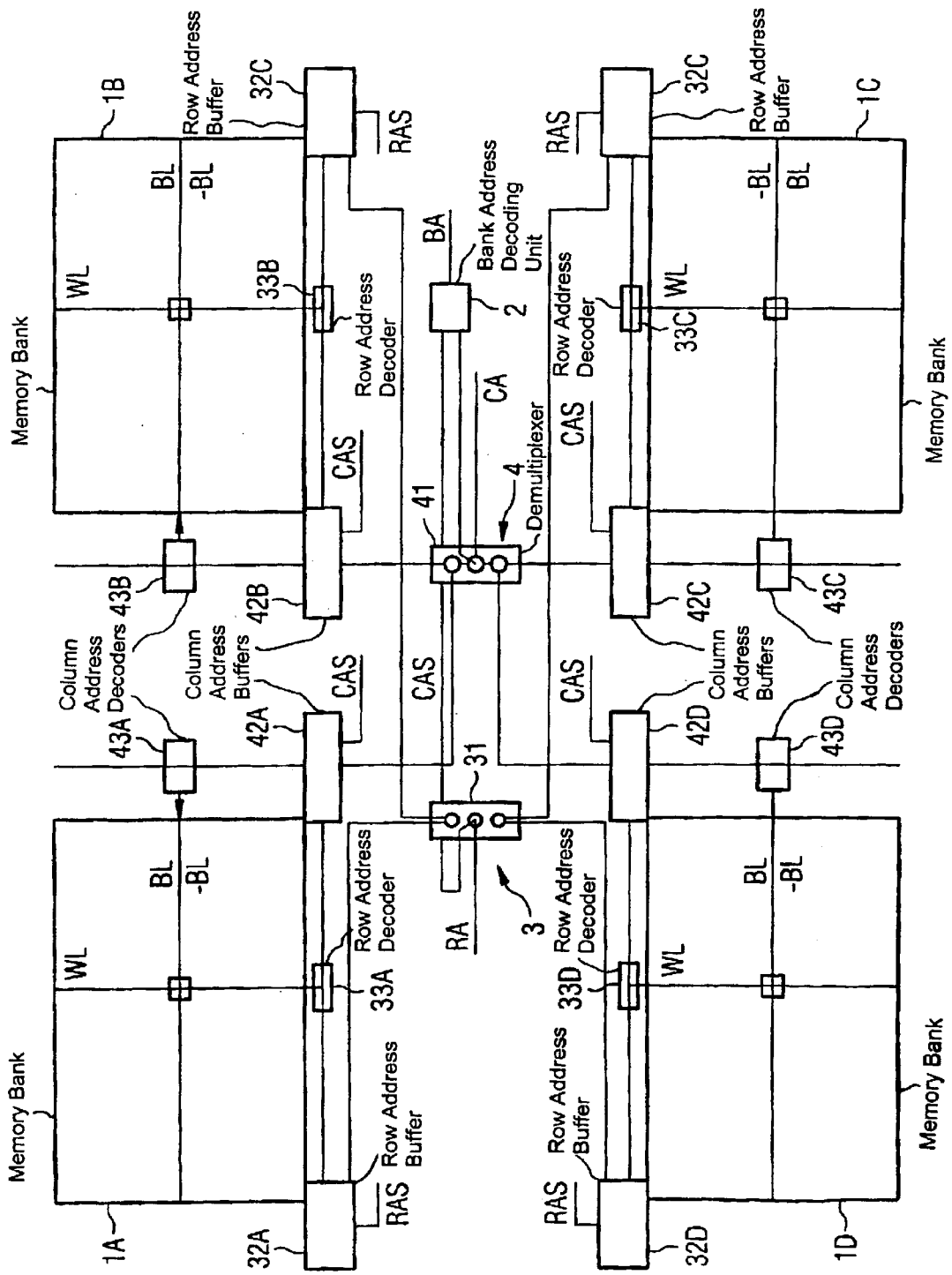
FIG. 1 is a block diagram of a first embodiment of the invention showing only the parts of a four memory bank DRAM memory that are necessary to understand the invention.

Referring now to the figures of the drawing in detail and first, particularly, to FIG. 1 thereof, there is shown a DRAM memory with four memory banks 1A to 1D that each include a matrix of memory cells and that are arranged so as to be distributed symmetrically over a semiconductor chip. For reasons of clarity, only one respective memory cell is shown in each memory bank. In the memory cells in the memory banks 1A to 1D, data can be stored and read out again. The memory cells in the memory banks are addressed using crossing word lines WL and bit line pairs BL, –BL.

In order to address the desired memory cell in one of the memory banks 1A to 1D, an address decoding circuit is provided on the memory chip. This address decoding circuit is arranged essentially centrally on the memory chip and is made up of a bank address decoding unit 2, a row address decoding unit 3 and a column address decoding unit 4. The row address decoding unit 3 in turn includes a demultiplexer 31 and, for each memory bank, a series circuit including a row address buffer 32 and a row address decoder 33. The column address decoding unit 4 is of similar design and has a demultiplexer 41 and, for each memory bank, a respective series circuit including a column address buffer 42 and a column address decoder 43.

The address decoding unit is designed such that the row address demultiplexer 31 and the column address demultiplexer 41 are each 1-of-4 demultiplexers. The data input of the row address demultiplexer 31 receives a row address signal RA, the data input of the column address demultiplexer 41 receives a column address signal. The four data inputs of the demultiplexers 31, 41 are respectively connected to a row address buffer memory 32 and a column address buffer memory 42. In addition, the row address demultiplexer 31 and the column address demultiplexer 41 are respectively connected to the bank address decoding unit 2 in order to be able to perform an appropriately address-controlled changeover operation between the data input and the four data outputs. Furthermore, the control inputs of the row address buffer memories 32 receive a signal derived internally from the row address activation signal RAS, and the control inputs of the column address buffer memories 42 receive a signal derived internally from the row activation signal CAS.

During access to a memory cell, the RAS signal, the CAS signal and possibly a read/write changeover signal WE are transferred to the DRAM memory. In addition, the address of the desired memory cell is loaded into the DRAM memory in three successive steps. In a first step, the bank address signal is applied to the bank address decoding unit 2, which decodes the memory bank with the addressed memory cell and outputs the decoded bank address signal to the control input of the row address demultiplexer 31 and of the column address decoder 41. Next, the row address RA is applied to the data input of the row address demultiplexer 31, which takes the decoded memory bank address as a basis for outputting the applied row address RA to the data output for the corresponding row address buffer memory 32. The addressed row address buffer memory 32 latches the applied row address signal if the signal which is applied to the control input and is derived internally from the RAS signal simultaneously indicates that the row address is valid.

The row address buffer memory then amplifies the row address signal and forwards it to the associated row address decoder 33. The row address decoder 33 then uses the row address to ascertain the row in the memory cell array of the memory bank which is addressed via the corresponding word line WL.

In the next step, the signal derived internally from the CAS signal is activated on the column address buffers 42, and the column address CA is applied to the data input of the column address demultiplexer 41. The column address demultiplexer 41 forwards the column address CA to the corresponding column address buffer memory 42 on the basis of the memory bank ascertained by the bank address decoder 2. The addressed column address buffer memory 42 then latches the column address and drives it to the column address decoder 43, which ascertains the desired column within the memory cell array and responds via the corresponding bit line pair BL/–BL.

During a read access, the bit found is output from the memory cell, is amplified by a sense amplifier (not shown) and is written to a data output buffer. During a write access, the read/write changeover signal WE is additionally activated. The write information is then written to the addressed memory cell via a data input buffer.

The inventive design of the address decoding unit with a row address demultiplexer and a column address demultiplexer, which only then forwards the applied row address and the applied column address to the address buffer memory whose memory bank contains the addressed memory cell, means that only one buffer memory needs to be reloaded.

This selective switching of the row and column addresses thus allows a significant power saving to be achieved. It would also be possible, in principle, to combine the row address demultiplexer and the column address demultiplexer in one unit. It is in fact also possible to achieve a significant power saving if, alternatively, only a row address demultiplexer or a column address demultiplexer is used.

Figure 2:
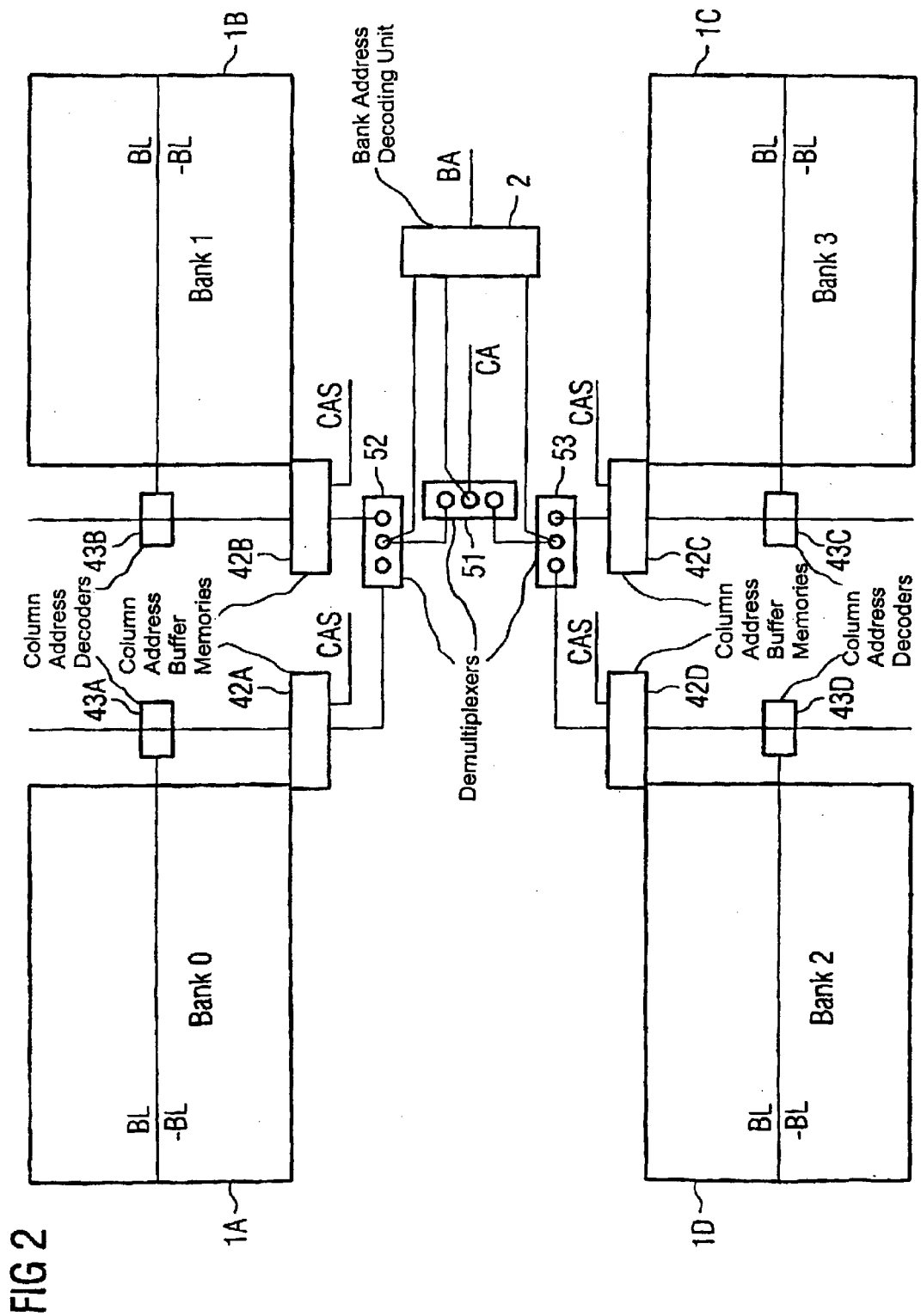
FIG. 2 is a block diagram of one possible further inventive embodiment of a column-address decoding unit of a DRAM memory.

FIG. 2 shows a second embodiment, in which a demultiplexer cascade circuit including a plurality of 1-of-2 demultiplexers is used instead of a 1-of-4 demultiplexer. For reasons of clarity, this second embodiment is shown only using the example of a column address decoding unit. It can similarly also be used for a row address decoding unit (not shown in FIG. 2), however.

In line with the second embodiment, for $2^m$ memory banks, where m is greater than 1, a number equal to $2^m-1$ of the 1-of-2 demultiplexers are required for such a cascade circuit. In the exemplary embodiment shown, in which four memory banks 1A to 1D are provided, three 1-of-2 demultiplexers 51, 52, 53 are required. These three demultiplexers 51, 52, 53 are changed over by the bank address decoding unit 2 under address control in each case. The cascade circuit shown in FIG. 2 has a central 1-of-2 demultiplexer 51, whose data input receives the call address CA. The first data output of the central 1-of-2 demultiplexer 51 is connected to the data input of a second 1-of-2 demultiplexer 52, whose first data output is connected to the first column address buffer memory 42A and whose second data output is connected to the second column address buffer memory 42B. The second data output of the central 1-of-2 demultiplexer 51 is connected to a data input of a third 1-of-2 multiplexer 53, whose first data output is connected to the third column address buffer memory 42C and whose second data output is connected to the fourth column address buffer memory 42D. In order to address a row in a memory cell matrix in a memory bank in order to access a memory cell, the bank address decoding unit 2 decodes the corresponding memory bank from the applied bank address BA and applies the decoded memory bank address to the 1-of-2 demultiplexer units 51, 52, 53. The control inputs of the central 1-of-2 demultiplexer 51, whose data input receives the column address CA, forward this column address to the second 1-of-2 demultiplexer 51 or to the third 1-of-2 demultiplexer 53, depending on whether the addressed memory bank is in the upper or lower memory chip half. The respective addressed 1-of-2 demultiplexer then in turn takes the decoded memory bank address as a basis for applying the column address to the associated column address buffer memory 42, which, if the CAS signal is applied to the control input, latches the column address and drives it on to the corresponding column address decoder 43. The column address decoder 43 in turn ascertains the desired column within the memory cell array in the memory bank which is addressed via the corresponding bit line pair BL/–BL.

This second embodiment of the column address demultiplexer formed as a cascade circuit including 1-of-2 demultiplexers has the advantage that the individual demultiplexers have very small proportions and can be accommodated in a space-saving manner. In addition, these 1-of-2 multiplexers with small proportions have only a low power consumption, which results in a further power saving as compared with a 1-of-n demultiplexer circuit.

The features of the invention that have been disclosed can be used both individually and in any desired combination for implementing the invention in its various embodiments.

We claim:

1. A semiconductor memory, comprising:
   at least two memory banks each having a memory cell matrix; and
   an address decoding unit including a bank address decoding unit, a row address decoding unit, and a column address decoding unit;
   said bank address decoding unit having a control input for obtaining a bank address;
   said row address decoding unit having a plurality of address buffer memories and a plurality of address decoders, each one of said memory banks associated with a respective one of said plurality of address buffer memories connected in series with a respective one of said plurality of address decoders;
   said column address decoding unit having a plurality of address buffer memories and a plurality of address decoders, each one of said memory banks associated with a respective one of said plurality of address buffer memories of said column address decoding unit connected in series with a respective one of said plurality of address decoders of said column address decoding unit;
   at least one component selected from a group consisting of said row address decoding unit and said column address decoding unit having a demultiplexer connected upstream of said plurality of address buffer memories of said row address decoding unit and/or connected upstream of said plurality of said address buffer memories of said column address decoding unit; and
   said demultiplexer connected to said bank address decoding unit for activating a corresponding one of said plurality of said address buffer memories of said row address decoding unit and/or a corresponding one of said plurality of said address buffer memories of said column address decoding unit based on the bank address being applied to said control input and being decoded by said bank address decoding unit.

2. The semiconductor memory according to claim 1, wherein:
   said memory banks are n memory banks, where n is greater than 2; and
   said demultiplexer is a 1-of-n demultiplexer.

3. The semiconductor memory according to claim 2, wherein:
   said memory banks are $2^m$ memory banks, where m is greater than 1; and
   said demultiplexer has a cascade circuit that includes $2^m-1$ 1-of-2 demultiplexers.

4. A method for loading an address for a memory cell in a semiconductor memory in order to access the memory cell, the method which comprises:
   providing the semiconductor memory with at least two memory banks each having a memory cell matrix, and an address decoding unit including a bank address decoding unit, a row address decoding unit, and a column address decoding unit, the bank address decoding unit having a control input for obtaining a bank address, the row address decoding unit having a plurality of address buffer memories and a plurality of address decoders, each one of the memory banks associated with a respective one of the plurality of address buffer memories connected in series with a respective one of the plurality of address decoders, the column address decoding unit having a plurality of address buffer memories and a plurality of address decoders, each one of the memory banks associated with a respective one of the plurality of address buffer memories of the column address decoding unit connected in series with a respective one of the plurality of address decoders of the column address decoding unit, at least one component selected from a group consisting of the row address decoding unit and the column address decoding unit having a demultiplexer connected to said bank address decoding unit and connected upstream of the plurality of address buffer memories of the row address decoding unit and/or connected upstream of the plurality of the address buffer memories of the column address decoding unit;

transferring an RAS signal and a CAS signal to the semiconductor memory;

applying a bank address signal to the bank address decoding unit to decode one of the memory banks containing an addressed memory cell and to output a decoded memory bank address signal to a control input of the demultiplexer;

applying a row address to a data input of the demultiplexer which, based on the decoded memory bank address, outputs an applied row address on a data output to an addressed address buffer memory of the row address decoding unit;

latching the applied row address in the addressed address buffer memory of the row address decoding unit if a signal being applied to a control input of the address buffer memory and being derived internally from the RAS signal indicates that the row address is valid;

amplifying a row address signal from the address buffer memory of the row address decoding unit and outputting the row address signal to an associated address decoder;

with the associated address decoder in the row address decoding unit, ascertaining a row address of a row in a memory cell array in a memory bank, which is being addressed via a corresponding word line, from the applied row address;

applying a column address to a data input on the demultiplexer which, based on the decoded memory bank address, outputs an applied column address on a data output to an addressed address buffer memory in the column address decoding unit;

latching the applied column address in the addressed address buffer memory in the column address decoding unit if a signal being applied to a control input of the address buffer memory and being derived internally from the CAS signal indicates that the column address is valid;

amplifying the column address signal from the address buffer memory in the column address decoding unit and outputting the column address signal to an associated address decoder in the column address decoding unit; and with the associated address decoder in the column address decoding unit, ascertaining a column address of a column in a memory cell array in a memory bank, which is being addressed via a corresponding bit line pair, from the column address signal.

5. The method according to claim 4, which comprises transferring a read/write changeover signal to the semiconductor memory.

* * * * *